(12) United States Patent
Lillestolen et al.

(10) Patent No.: US 10,054,635 B2
(45) Date of Patent: Aug. 21, 2018

(54) INTEGRATED SYSTEM AND METHOD FOR TESTING SYSTEM TIMING MARGIN

(71) Applicant: Hamilton Sundstrand Corporation, Charlotte, NC (US)

(72) Inventors: Kirk A. Lillestolen, East Hartford, CT (US); Gary L. Hess, Enfield, CT (US)

(73) Assignee: Hamilton Sunstrand Corporation, Charlotte, NC (US)

( * ) Notice: Subject to any disclaimer, the term of this patent is extended or adjusted under 35 U.S.C. 154(b) by 76 days.

(21) Appl. No.: 15/149,897

(22) Filed: May 9, 2016

(65) Prior Publication Data

US 2017/0322588 A1    Nov. 9, 2017

(51) Int. Cl.
*G06F 1/08*    (2006.01)
*G01R 31/317*    (2006.01)

(52) U.S. Cl.
CPC ......... *G01R 31/31727* (2013.01); *G06F 1/08* (2013.01)

(58) Field of Classification Search
CPC ............................. G01R 31/31727; G06F 1/08
See application file for complete search history.

(56) References Cited

U.S. PATENT DOCUMENTS

| | | | |
|---|---|---|---|
| 6,477,659 B1 | 11/2002 | Ho | |
| 7,809,052 B2 | 10/2010 | Li | |
| 8,283,933 B2 | 10/2012 | Dasnurkar | |
| 8,958,515 B2 | 2/2015 | Cai et al. | |
| 2007/0255974 A1 | 11/2007 | Gilday et al. | |
| 2010/0237914 A1 | 9/2010 | Katoh | |
| 2012/0098571 A1* | 4/2012 | Feist | G01R 31/31708 327/10 |
| 2016/0041212 A1* | 2/2016 | Darbinyan | G01R 29/0273 327/33 |

FOREIGN PATENT DOCUMENTS

JP    2009294164 A    12/2009

OTHER PUBLICATIONS

Extended European Search Report for European Patent Application No. 17169461.5, dated Oct. 12, 2017.

* cited by examiner

*Primary Examiner* — Albert Wang
(74) *Attorney, Agent, or Firm* — Locke Lord LLP; Scott D. Wofsy; Joshua L. Jones

(57) ABSTRACT

A built-in test circuit for testing a system timing margin of a processing device under-test is provided. The processing device includes a controller and first clock circuit, wherein the first clock circuit generates a first clock signal and the first clock signal is a main clock signal provided for operation of the processing device. The built-in test circuit includes a second clock circuit and a logic circuit, both of which are integrated with the processing device. The second clock circuit generates a second clock signal. The logic circuit processes the first and second clock signals and outputs a third clock signal. The third clock signal is used to determine system timing margin of the processing device.

18 Claims, 7 Drawing Sheets

INTEGRATED SYSTEM AND METHOD FOR TESTING SYSTEM TIMING MARGIN

BACKGROUND OF THE DISCLOSURE

1. Field of the Invention

The present disclosure relates to a method and test circuit for testing system timing margin of a processing system, and more particularly to a method and built-in test circuit that is integrated into the processing system for testing the system timing margin of the processing system.

2. Description of Related Art

The clock speeds of processing systems have been increasing over time. Conventionally, timing analyses were not concerned with sources of small timing error, such as jitter. However, with timing margins reaching the order of sub nS, such timing errors have become critical.

Attempts to determine timing margins have traditionally been performed on a single production unit that serves as a sample unit for a batch of units. However, each unit has its own particular sources of errors and delays and noise signature such that timing margin limits may be unique to each unit. Methods for testing for system timing margins have also been attempted using connectors to couple each unit to testing equipment, however the connectors themselves can introduce timing error. Additionally, laboratory testing is limited to conditions at the time at which the test is performed. However, once a unit is removed from the laboratory, conditions that the unit is exposed to, such as changes in temperature, may affect the unit's system timing margin.

Such conventional methods and systems have generally been considered satisfactory for their intended purpose. However, there is still a need in the art for improved methods for determining processing system timing margins for individual units over a range of testing conditions, without introducing additional error. The present disclosure provides a solution for these problems.

SUMMARY OF THE INVENTION

The subject disclosure is directed to a built-in test circuit for testing system timing margin of a processing device. The processing device includes a controller and first clock circuit, wherein the first clock circuit generates a first clock signal and the first clock signal is a main clock signal provided for operation of the processing device. The built-in test circuit includes a second clock circuit and a logic circuit, both of which are integrated with the processing device. The second clock circuit generates a second clock signal. The logic circuit processes the first and second clock signals and outputs a third clock signal. The third clock signal is used to determine system timing margin of the processing device.

In accordance with embodiments of the disclosure, the second clock signal is asynchronous relative to the first clock signal. Additionally, in embodiments, the frequency of the second clock signal can be adjustable. Furthermore in embodiments, the logic circuit can include a first logic gate that receives the second clock signal and the third clock signal and outputs a logic signal, wherein the third clock can be received as a feedback signal to the logic circuit.

In embodiments, the logic circuit can further include a second logic gate that receives the first clock signal and the logic signal and outputs the third clock signal. In addition, in embodiments, the first logic gate can be a logic OR gate and the second logic gate can be a logic AND gate. Furthermore, in embodiments, the frequency of the second clock signal is adjusted by a programmable PLL device.

In embodiments, the programmable PLL device can be controlled by the controller.

Additionally, in embodiments, a pulse width of the third clock signal can be based on the frequency of the second clock signal as adjusted by the programmable PLL.

In addition, in embodiments, a rising edge of the third clock signal can be synchronized with a next rising edge of the second clock signal.

In embodiments, the second clock circuit can be configured to maintain the second signal at a steady value when the processing device is configured for normal operation of the processing device during which testing for system timing margin is disabled to cause the third clock signal output by the logic circuit to be synchronized with the first clock signal steady value.

In accordance with aspects of the disclosure, a processing device is provided that includes a controller, a first clock that generates a first clock signal, and the built-in-test circuit, wherein the first clock signal is a main clock signal provided for operation of the processing device. The processing device can include an oscillator outputting an oscillation signal and a programmable PLL receiving and modifying frequency of the oscillation signal and outputting the modified oscillation signal as the second clock signal.

Furthermore, in accordance with aspects of the disclosure, a method is provided for testing a system timing margin of a processing device under-test. The method includes generating, internal to the processing device, a second clock signal that is asynchronous relative to a first clock signal, wherein the first clock signal is a main clock signal provided for operation of the processing device. The method further includes processing, internal to the processing device, the first clock signal and the second clock signal, outputting a third clock signal based on the processing of the first and second clock signals, and determining system timing margin of the processing device using the third clock signal.

In embodiments, processing the first and second clock signals can include processing the third clock signal as a feedback signal with the first and second clock signals to hold the state of the third clock signal that is output until the first clock signal changes state. Additionally, in embodiments, processing the first and second clock signals can include processing the second clock signal and the third clock signal, the third signal being provided as a feedback signal, using a logic OR operation, outputting a logic signal based on a result of the OR operation, and processing the first clock signal and the logic signal using a logic AND operation, wherein the output of the AND operation is the third clock signal.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Embodiments of the disclosure include a built-in test circuit, a processing device with an integrated built-in test circuit for determining system timing margins, and methods of determining system timing margins of a processing device.

Figure 1:
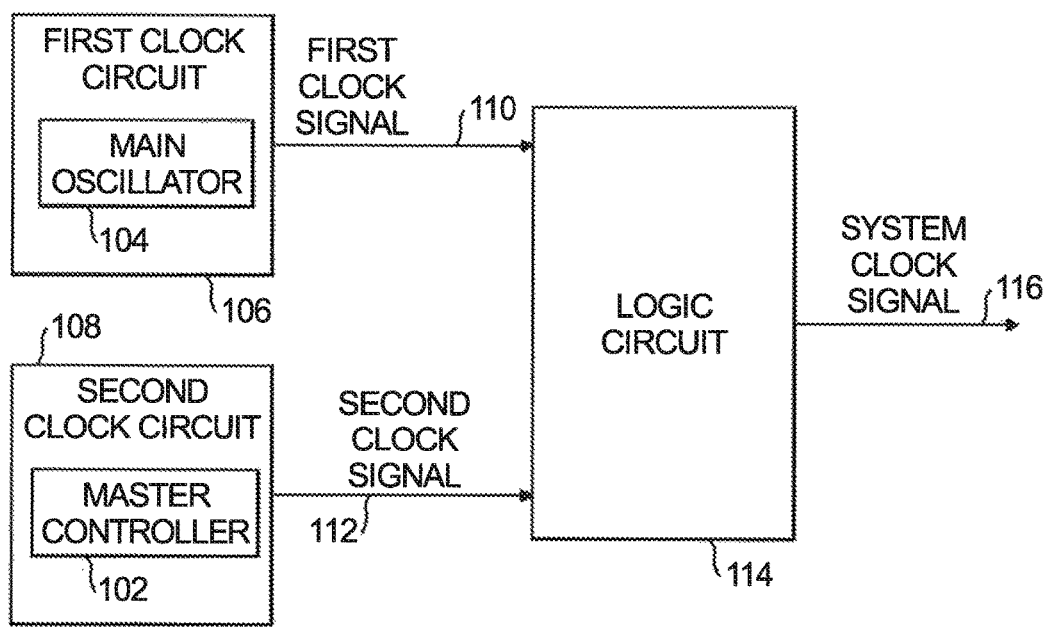
FIG. 1 is a block diagram illustrating a processing device having an example built-in test circuit for determining system timing margin in accordance with an embodiment of the disclosure.

Reference will now be made to the drawings wherein like reference numerals identify similar structural features or aspects of the subject disclosure. For purposes of explanation and illustration, and not limitation, a block diagram of an exemplary embodiment of a processing device with a built-in test circuit in accordance with the disclosure is shown in FIG. 1 and is designated generally by reference character 100. Other embodiments of built-in test circuits in accordance with the disclosure, or aspects thereof, are provided in FIGS. 2-6, as will be described. A processing device 100 with a built-in test circuit is shown in FIG. 1. The built-in test circuit is integrated with the processing device 100. The term "integrated with," as used herein, refers to being embedded in a non-removable fashion, such as using a single substrate and/or being housed within the same housing. Two integrated circuits can share components, which can include electronic components and/or physical components, such as a controller, oscillator, substrate, data bus, and/or housing.

The processing device 100 includes a master controller 102 and a main oscillator 104. The master controller 102 controls functionality of the processing device 100, and the main oscillator 104 provides a clock signal that is used by the master controller 102 for functionality of the processing device 100. The master controller 102 can be, for example, a microprocessor, microcontroller, a field programmable gate array (FPGA), application specific integrated circuit (ASIC) or programmable logic device (PLD). The main oscillator 104 can be, for example, a clock oscillator, a crystal oscillator or a PLL output.

The processing device 100 includes a first clock circuit 106 and a second clock circuit 108. The first clock circuit 106 includes at least the main oscillator 104 and outputs a first clock signal 110. The first clock circuit 106 can optionally include one or more components that operate on output of the main oscillator 104.

The second clock circuit 108 includes at least the master controller 102 and outputs a second clock signal 112 that is asynchronous relative to the first clock signal 110. Additionally, the second clock signal 112 has a higher frequency than the first clock signal 110. The second clock circuit 108 further includes one or more components that controllably adjust the frequency of the second clock signal 112. The built-in test circuit includes components of at least one of the first clock circuit 106 and the second clock circuit 108. The built-in test circuit further includes a logic circuit 114 to process the first clock signal 110 and the second clock signal 112 and output a third clock signal, referred to as the system clock signal 116. The logic circuit 114 further processes the system clock signal 116 as a feedback signal to generate a next instance of the system clock signal 116.

The logic signal causes the system clock signal 116 to change from LOW to HIGH when both the first clock signal 110 and the second clock signal are HIGH, and to change from HIGH to LOW when both the first clock signal 110 and the second clock signal are LOW. Due to the asynchronous relationship between the first and second clock signals 110, 112, and the function of the logic circuit, the system clock 116 output by the processing device 100 mimics the system clock with applied jitter, wherein the jitter such that the lengths of respective pulses of the system clock signal 116 grow and shrink depending on the behavior of the second clock signal in relation to the first clock signal.

Figure 2:
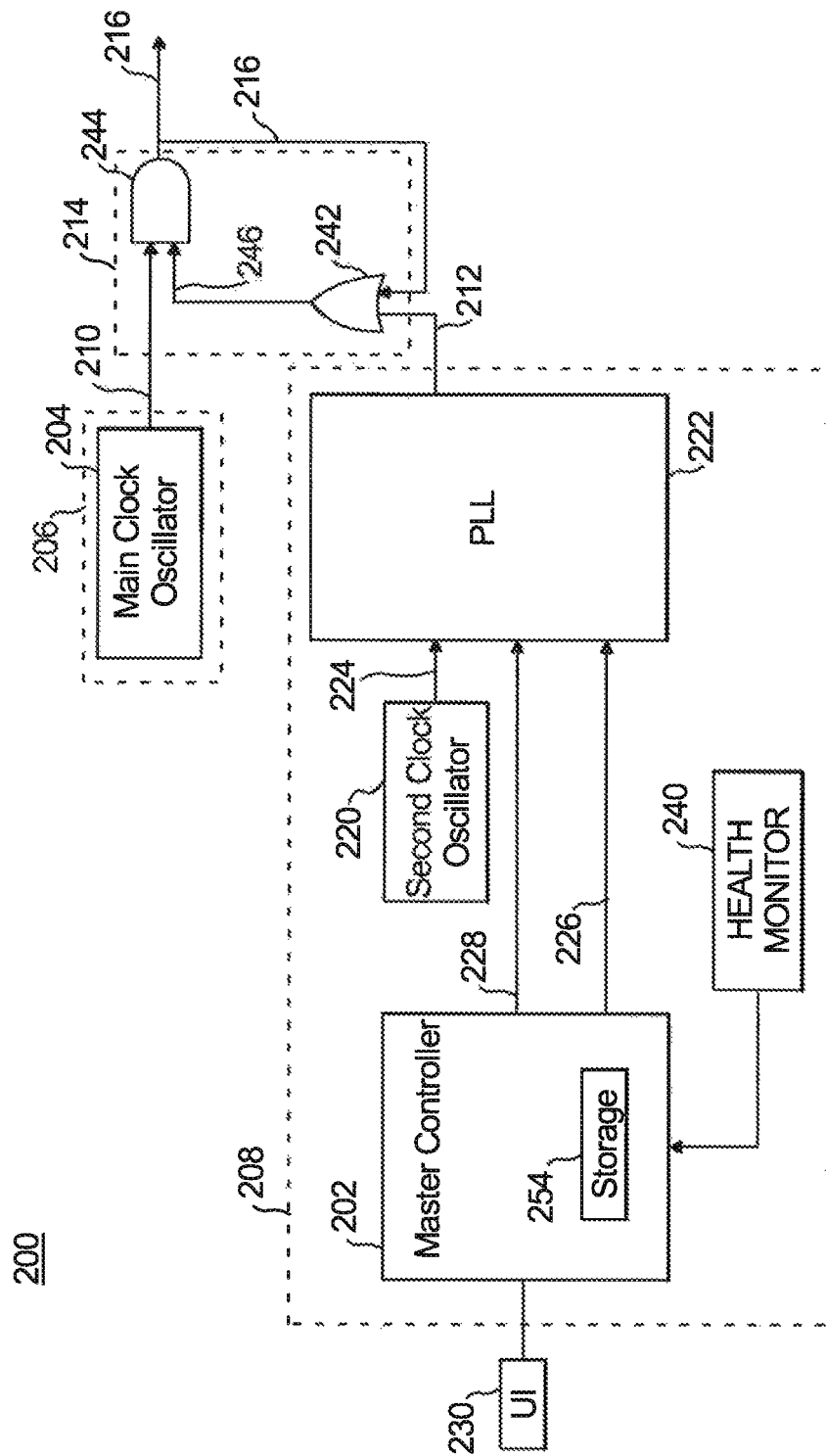
FIG. 2 is a block diagram illustrating a processing device having another embodiment of a built-in test circuit for determining system timing margin in accordance with an embodiment of the disclosure.

FIG. 2 illustrates an embodiment of an example processing device 200 with a built-in test circuit. Processing device 200 includes a master controller 202 and a main oscillator 204, similar in structure and function to the master controller 102 and main oscillator 104 shown and described with respect to FIG. 1. The processing device 200 further includes a first clock circuit 206 and a second clock circuit 208. The first clock circuit 206 includes the main oscillator 204. The main oscillator 204 outputs first clock signal 210, which is provided to logic circuit 214.

The second clock circuit 208 includes the master controller 202, a second clock oscillator 220, and a phase lock loop (PLL) device 222. The second clock oscillator 220 is a high frequency noise injection source. For example, the second clock oscillator 220 can be a 2 GHz clock with a predetermined resolution, such as 500 pS. The second clock oscillator 220 can be, for example, a clock oscillator, a crystal oscillator or a PLL output. The second clock oscillator 220 outputs a high frequency signal that is provided as a clock-in signal to the PLL device 222 via signal path 224. The PLL device 222 is a programmable device that can modify the frequency of the high frequency signal provided by the PLL device 222. The PLL device 222 receives an enable signal via signal path 226 and a configuration signal via signal path 228 from the master controller 202 that enable and configure the PLL device 222 to modify the high frequency signal. The signal path 228 can be, for example, a bus or the like. Modifications to the high frequency signal can include incremental changes, such as by modifying the high frequency signal by fixed steps in a selected direction, wherein the steps are greater than or equal to the resolution (e.g., pulse width) of the second clock oscillator 220, e.g., 500 pS. The modified clock signal is output by the PLL 222 as a clock-out signal that operates as the second clock signal 212.

The master controller 202 can be programmed to control the PLL device 222, including enabling modifications to the high frequency signal and controlling the direction (increase or decrease), timing and magnitude of frequency changes to the high frequency signal by the PLL device 222. The master controller 202 can further be coupled to a user interface device 230 that a user can operate to request that the master controller 202 control the PLL device 222 according to user selected criteria.

The PLL device 222 outputs the second clock signal 212 to the logic circuit 214. The logic circuit 214 processes the first clock signal 210, the second clock signal 212, and a feedback signal 216, and further outputs a system clock signal 216. The system clock signal 216 output by the logic circuit 214 is also provided as an input to the logic circuit 214, referred to herein as feedback signal 216. Since the system clock signal 216 and the feedback signal 216 are both the same signal, they are referenced by the same reference numeral, 216.

In particular, logic circuit 214 can include a first logic gate 242 and a second logic gate 244. The second clock signal 212 and the system clock signal (provided as a feedback signal from the output of the logic circuit 214)) are provided as inputs to the first logic gate 242, which then outputs a logic signal via signal path 246. The first clock signal 210 and the logic signal are provided as inputs to the second logic gate 244. The second logic gate 244 outputs the system clock signal 216. In the example shown, the first logic gate 242 is an OR gate and the second logic gate is an AND gate. The disclosure is not limited to the particular logic circuit 214 shown. The logic circuit 214 can be provided with different logic gates, different inputs to each logic gate, and/or a different amount of logic gates to achieve similar results.

When the processing device 200 is being operated for normal operation and testing for system timing margin is disabled, the second clock signal 212 can be held at a steady value so that the system clock signal is synchronized with the first clock signal 210 such that the rising and falling edges of the system clock signal 216 and the first clock signal 210 occur at substantially the same time. In accordance with the example logic circuit 214 shown, the second clock signal 212 would be held at a steady high value during normal operation of the processing device 200.

In addition, the processing device 200 can include at least one built-in system health monitor 240 that determines or detects if the processing device 200 is unhealthy, e.g., not operating correctly. The health monitors 240 can include hardware or software. Examples of health monitors include watch dog timers, memory tests, loss of clock detectors, loss of communication detectors, etc. The health monitors 240 are provided and configured based on the system in which they are implemented and criticality of features being monitored. The health monitors 240 can be continually operating in the background of the processing device's operations, or can be included with an initialization, commanded, and/or scheduled built in test routine (BIT).

The master controller 202 can control the PLL 222 to incrementally change the frequency of the second clock signal 212, causing the amount of jitter (lengthening or shrinking of pulses) to the system clock signal 216 to incrementally change. The master controller 202 can access a storage device 254 that stores a current frequency of the second clock signal 212. Detection of an unhealthy condition by one of the health monitors 240 can be an indication that the system timing margin has been exceeded. The system timing margin refers herein to timing variation of the system clock that the processing device 200 is capable of handling without exhibiting an unhealthy condition.

Since the storage device 254 stores at least the most recent frequency of the second clock 212 (also referred to as a set point), the most recent frequency value stored when an unhealthy condition was detected can be used by the master controller 202 to determine the frequency of the second clock signal 212 when the health monitors 240 detected an unhealthy condition. This last frequency value (set point) can then be used to determine the system timing margin.

Figure 3:
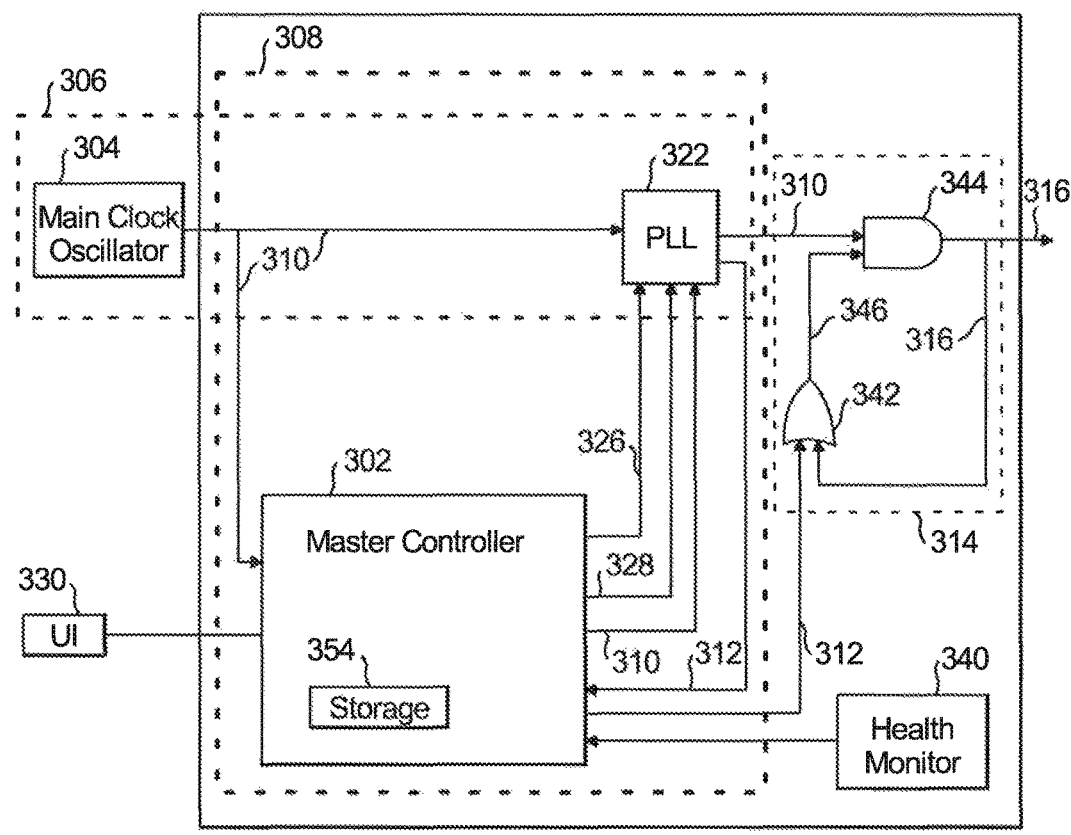
FIG. 3 is a block diagram illustrating a processing device having a further embodiment of a built-in test circuit for determining system timing margin in accordance with an embodiment of the disclosure.

With reference now to FIG. 3, an embodiment of another example processing device 300 with a built-in test circuit is shown. Processing device 300 includes a master controller 302 and a main clock oscillator 304, similar in structure and function to the master controller 102 and main clock oscillator 104 shown and described with respect to FIG. 1. The processing device 300 further includes a first clock circuit 306 and a second clock circuit 308. The first clock circuit 306 includes the main oscillator 304 and a PLL device 322. The main oscillator 304 outputs the first clock signal 310 that can pass through the PLL device 322. The PLL device 322 outputs the first clock signal 310 to logic circuit 314 without modifying the first clock signal 310. The second clock circuit 308 includes the master controller 302 and the PLL device 222. The first clock signal 310 is provided to the master controller 302. The master controller 302 provides the first clock signal 310 to the PLL 322 as a clock-in input. The PLL device 322 is a programmable device that can be configured by the master controller 302. The PLL device 322 receives the first clock signal 310 from the master controller 302 as a clock-in signal, incrementally modifies the frequency of the received first clock signal 310, and provides the modified signal as the second clock signal 312 to the master controller 202. The master controller 302 outputs the second clock signal 312 as a clock-out.

The PLL device 322 can receive an enable signal via signal path 326 and a configuration signal via signal path 328 from the master controller 302 that enable and configure the PLL device 322 to modify the first clock signal 310. The signal path 328 can be, for example, a bus or the like. The master controller 302 can be programmed to control the PLL device 322, including controlling the direction, timing, and magnitude of frequency changes to the first clock signal 310 for generating the second clock signal 312 by the PLL device 322. The master controller 302 can further be coupled to a user interface device 330 that a user can operate to request that the master controller 302 control the PLL device 322 according to user selected criteria.

The main controller 302 can receive the first clock signal 310 as its clock input to clock processing and logic of the master controller 302. The PLL outputs the first clock signal 310 and the second clock signal 312. The first and second clock signals 310 and 312 are asynchronous, with the second clock signal 312 having a higher frequency than the first clock signal 310. The first clock signal 310 is provided from the PLL 322 to the logic circuit 314, such as to second logic device 344. The second clock signal 312, in embodiments, is input to the main controller 302 in order that the master controller 302 can use the second clock signal 312 internally, such as to store the frequency in storage device 354. The master controller 302 can provide the second clock signal 312 to the logic circuit 314, such as to the first logic device 342. In embodiments, the PLL can provide the second clock signal directly to the logic circuit 314, such as to the first logic device 342.

The logic circuit 314 processes the first clock signal 310, the second clock signal 312, and a feedback signal 316, and further outputs a system clock signal 316. The system clock signal 316 output by the logic circuit 214 is also provided as an input to the logic circuit 314, referred to herein as feedback signal 316. Since the system clock signal 316 and the feedback signal 316 are both the same signal, they are referenced by the same reference numeral, 316.

In particular, logic circuit 314 can include a first logic gate 342 and a second logic gate 344. The second clock signal 312 and the system clock signal (provided as a feedback signal from the output of the logic circuit 314)) are provided as inputs to the first logic gate 342, which then outputs a logic signal via signal path 346. The first clock signal 310 and the logic signal are provided as inputs to the second logic gate 344. The second logic gate 344 outputs the system clock signal 316. The second logic gate 344 outputs the system clock signal 316. In the example shown, the first logic gate 342 is an OR gate and the second logic gate is an AND gate. The disclosure is not limited to the particular logic circuit 314 shown. The logic circuit 314 can be provided with different logic gates, different inputs to each logic gate, and/or a different amount of logic gates to achieve similar results.

In addition, the processing device 300 can include at least one built-in system health monitor 340 that determines or detects if the processing device 300 is unhealthy, e.g., not operating correctly.

As the master controller 302 controls the PLL 322 to incrementally change the frequency of the second clock signal 312, an amount of jitter (lengthening or shrinking of pulses) to the system clock signal 316 is incrementally changed. Detection of an unhealthy condition by one of the health monitors 340 can be an indication that the system timing margin has been exceeded. The master controller 302 can access a storage device 354 that stores a current frequency of the second clock signal 312. When processing device 300 performs in normal operation in which testing for system timing margin is disabled, the second clock signal 312 is set to a steady value (such as high), so that the processing device 300 operates without injected jitter and the system clock signal 316 is synchronized with the first clock signal 310 such that the rising and falling edges of the system clock signal 316 and the first clock signal 310 occur at the same time. In accordance with the example logic circuit 314 shown, the second clock signal 312 would be held at a steady high value during normal operation of the processing device 300.

Since the storage device 354 stores at least the most recent frequency value of the second clock signal 312, the most recent frequency value stored when an unhealthy condition was detected can be used by the master controller 302 to determine the frequency of the second clock signal 312 when the health monitors 340 detected an unhealthy condition. This frequency value can then be used to determine the system timing margin.

Figure 4:
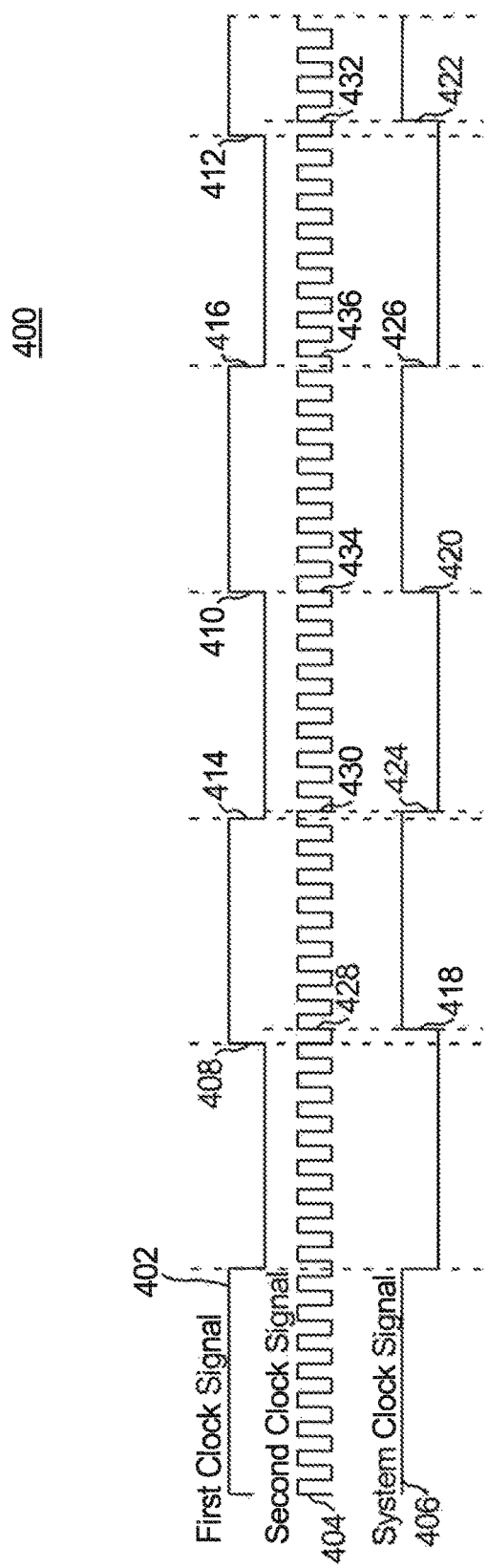
FIG. 4 is a timing diagram illustrating timing relationships between signals generated by a processing device and a built-in test circuit in accordance with an embodiment of the disclosure.

FIG. 4 illustrates a timing diagram 400 showing the timing relationship of a first clock signal 402, a second clock signal 404, and a system clock signal 406. The second clock signal 404 is asynchronous to the first clock signal 402 and of significantly higher frequency than the first clock signal 402. The first clock signal 402 has pulses with rising edges 408, 410, and 412, and falling edges 414, and 416. The system clock signal 406, which is output by logic circuit (such as logic circuits 114, 214, or 314 shown in FIGS. 1, 2, and 3), has rising edges 418, 420, and 422, and falling edges 424 and 426.

Operation of the logic circuit causes a rising edge of the system clock signal 406 to be synchronized with a next rising edge of the second clock signal 408 when the first clock signal 402 is high. The rising edge of the system clock signal 406 is thus adjusted with respect to the second clock signal 404, effectively creating jitter on the system clock signal 406. Similarly, the logic circuit causes a falling edge of the system clock signal 406 to be synchronized with a next falling edge of the second clock signal 408 when the first clock signal 402 is low. The falling edge of the system clock signal 406 is thus adjusted with respect to the second clock signal 404, effectively creating jitter on the system clock signal 406. The jitter introduced on the system clock signal 406 causes the pulses of the system clock signal 406 to increase and decrease relative to the first clock signal 402.

Specifically, rising edge 418 of the system clock signal 406, which is triggered by the rising edge 408 of the first clock signal 402, is synchronized with the next rising edge 428 of the second clock signal 404. Similarly, rising edge 422 of the system clock signal 406, which is triggered by the rising edge 412 of the first clock signal 402, is synchronized with the next rising edge 432 of the second clock signal 404. In a similar fashion, falling edge 424 of the system clock signal 406, triggered by the falling edge 414 of the first clock signal 402, is synchronized with the next falling edge 430 of the second clock signal 404.

A master controller, such as master controller 102, 204, or 304 in FIGS. 1, 2, and 3, can incrementally adjust, step-by-step, frequency of the second clock signal 404 to the point of failure. The frequency of the adjusted second clock signal 404 can be recorded in memory of the master controller, such as storage device 254 or 354 of FIGS. 2 and 3. When failure is detected, the value of the frequency last stored in the memory is determined and is used to determine the system timing margin.

Accordingly, in some embodiments a single oscillator can be used that outputs a main clock, and one or more PLLs can operate on the main clock to output two independent clock signals that are asynchronous relative to one another.

Figure 5:
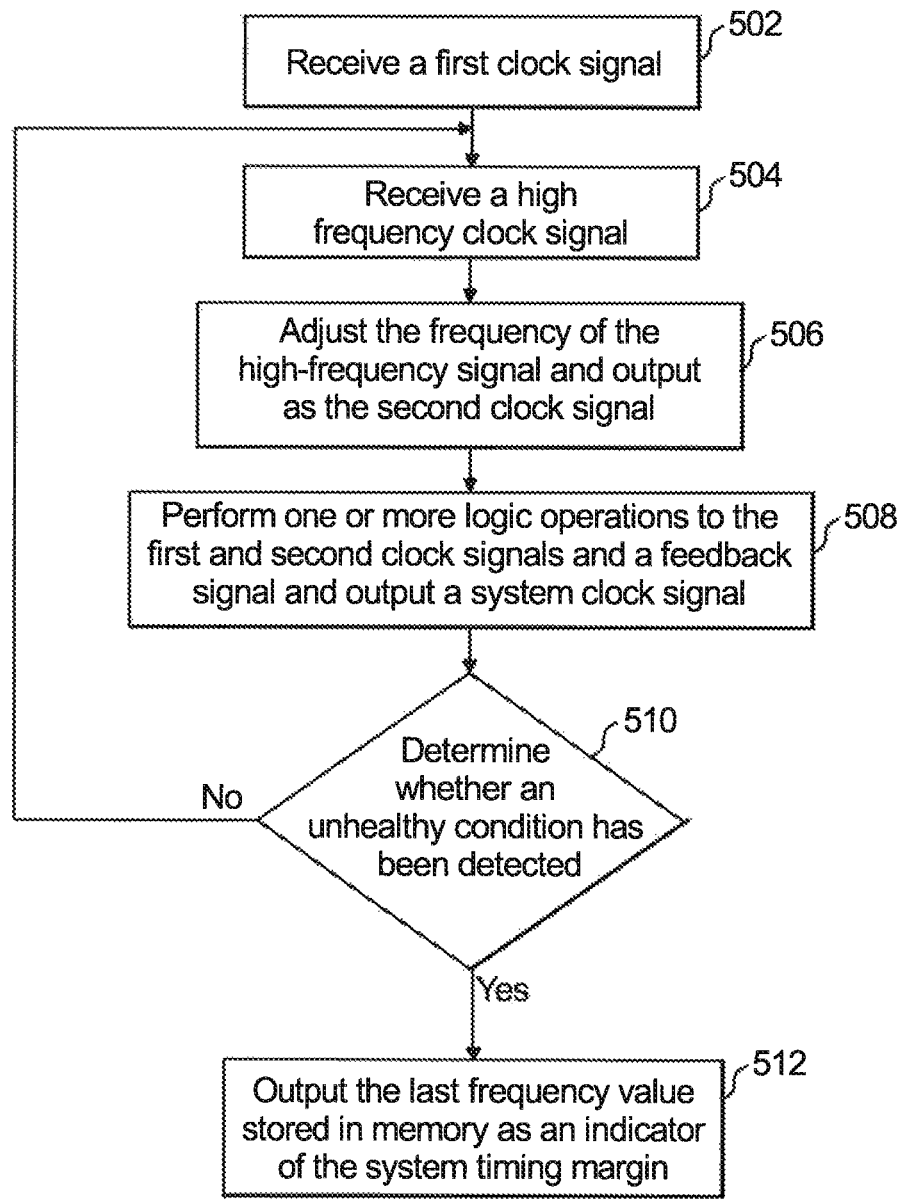
FIG. 5 is a flowchart illustrating an example method of determining system timing margin in accordance with an embodiment of the disclosure.
Figure 6:
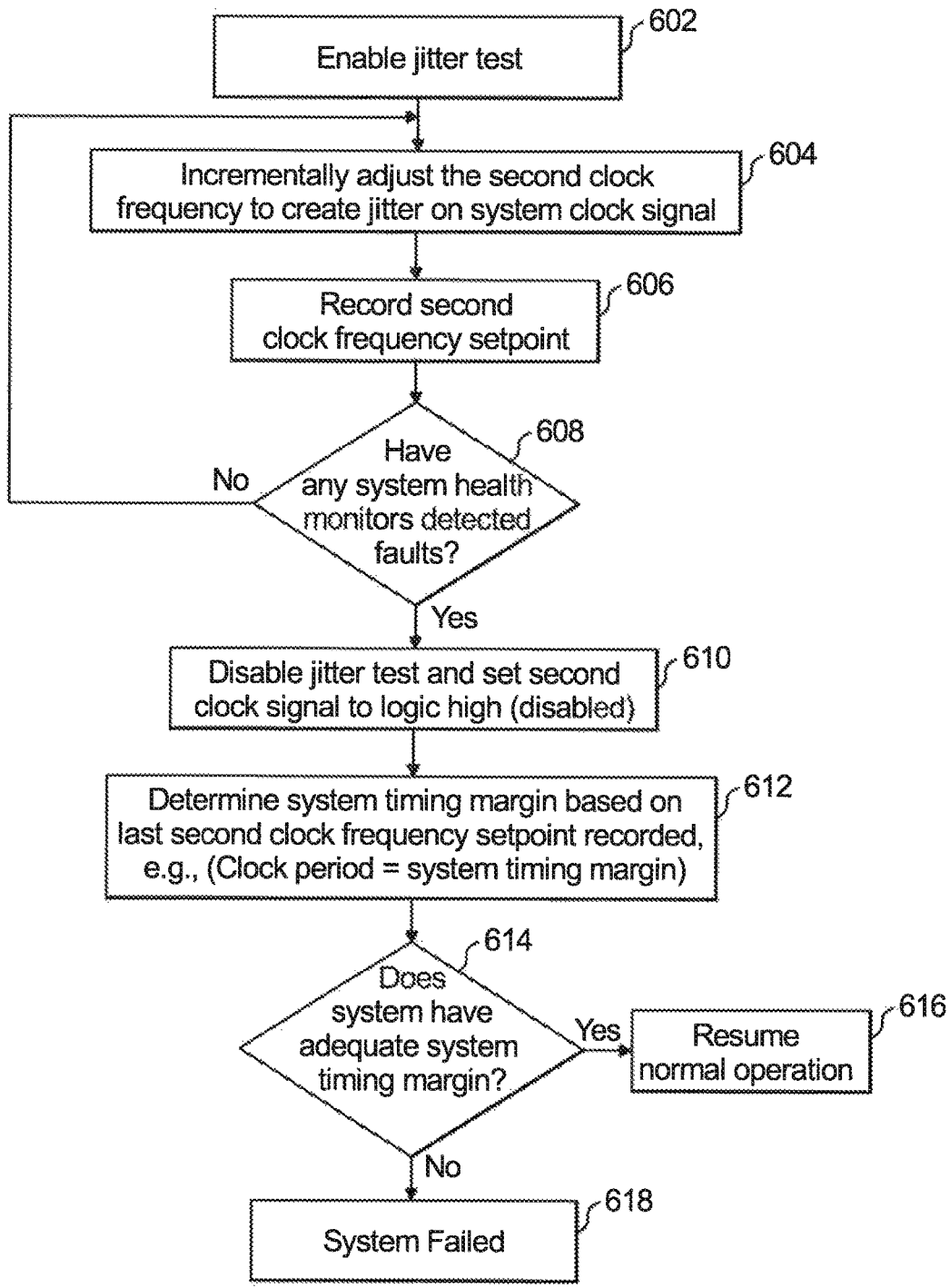
FIG. 6 is a flowchart illustrating an example method of processing output from system health monitors to determine the system timing margin.

With reference now to FIGS. 5 and 6, shown are flowcharts demonstrating implementation of the various exemplary embodiments. It is noted that the order of operations shown in FIGS. 5 and 6 is not required, so in principle, the various operations may be performed out of the illustrated order. Also certain operations may be skipped, different operations may be added or substituted, or selected operations or groups of operations may be performed in a separate application following the embodiments described herein. The operations shown in FIGS. 5 and 6 are performed by a built-in test circuit of a processing device and a master controller of the processing device, wherein the built-in test circuit includes a PLL or the like and a logic circuit.

With reference to FIG. 5, at operation 502, a first clock signal is received. At operation 504 a high-frequency clock signal is received that is asynchronous to the first clock signal. At operation 506, the frequency of the high-frequency clock signal is adjusted and output as the second clock signal. At operation 508, one or more logic operations are applied to the first and second clock signals and a feedback signal, and a system clock signal is output. The system clock signal is also provided as input to the logic operations as the feedback signal. At operation 510, a determination is made whether an unhealthy condition has been detected (e.g., by one or more health monitors, such as health monitors 240 or 340 of FIGS. 2 and 3). If the determination at operation 510 is NO, the method continues at operation 504. If the determination at operation 510 is YES, at operation 512, the last frequency value stored in the memory is retrieved and output as an indicator of the system timing margin.

With reference to FIG. 6, at operation 602, a jitter test is enabled for determining system timing margin. At operation 604, the frequency of a second clock (also referred to as the second clock frequency) is incrementally adjusted to create jitter on a system clock signal. At operation 606, the current second clock frequency is recorded as a set point. At operation 608, a determination is made whether any system health monitors have detected a fault that indicates an unhealthy condition. Of the determination at operation 608 is NO, the method continues at operation 604. If the determination at operation 608 is YES, the method continues at operation 610.

At operation 610, the jitter test is disabled and the second clock is set to a value that does not cause jitter to be created on the system clock signal. In the current example that uses the example logic circuits 214 and 314 shown in FIG. 2 and FIG. 3, the second clock signal is set to HIGH to disable the jitter test, At operation 612, the system timing margin is determined based on the last second clock frequency set point recorded when a fault was detected by the system health monitors. In the example shown, the system timing margin is equal to a clock period of the second clock signal based on the last second clock frequency set point.

A determination is made at operation 614 whether the system being tested has an adequate timing margin. If the determination at operation 614 is YES, then the method continues at operation 616 in which the system resumes normal operation. If the determination at operation 614 was NO, then the method continues at operation 618, at which it is determined that the system has failed. Operation 618 may include generating a system failure notification.

Aspects of the present disclosure are described above with reference to flowchart illustrations and/or block diagrams of methods, apparatus (systems) and computer program products according to embodiments of the disclosure. It will be understood that certain blocks of the flowchart illustrations and/or block diagrams, and combinations of blocks in the flowchart illustrations and/or block diagrams, can be implemented by hardware (e.g., logic circuits or analog devices), firmware (e.g., FPGA or ASIC), and/or computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

Figure 7:
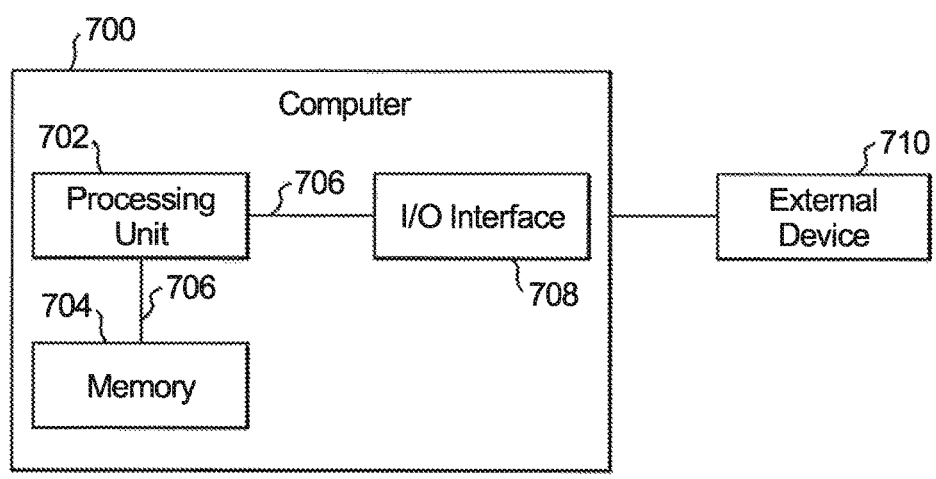
FIG. 7 is a block diagram illustrating an example computer system in accordance with an embodiment of the disclosure.

With reference to FIG. 7, the master controller (e.g., master controller 102, 202, and 302 shown in FIGS. 1, 2, and 3) and/or analyzer 250 and 350 (shown in FIGS. 2 and 3) can be configured, for example, as a computer system 700. Computer system 700 is only one example of a suitable system and is not intended to suggest any limitation as to the scope of use or functionality of embodiments of the disclosure described herein. Regardless, computer system 700 is capable of being implemented and/or performing functionality set forth hereinabove.

Computer system 700 is shown in FIG. 7 in the form of a general-purpose computing device. The components of computer system 700 may include, but are not limited to, one or more processors or processing units 702, memory devices 704, and a connector or bus 706 that couples various system components including the memory devices 704 to the processing unit 702.

The memory devices 704 can include system memory that include system memory having readable media in the form of volatile memory, such as random access memory (RAM) and/or cache memory. Memory devices 704 may further include other removable/non-removable, volatile/non-volatile computer system storage media, such as for storing program data (e.g., frequency values) and/or software modules having programmable instructions that are configured to carry out certain functions of embodiments of the disclosure.

Computer system 700 may also include an Input/Output (I/O) interface 708 for communicating with one or more external devices 710, such as a keyboard, a pointing device, a display, and/or another computing device. The built-in test circuit is provided for individual processing devices. Each processing device unit produced that includes the built-in test circuit can be subjected to a controlled injection of jitter to determine a timing margin for that individual device throughout the life of the processing device and in the particular conditions (e.g., temperature) that the processing device is operated. Thus system time margins can be determined for each unit, taking into account various factors that affect system time margins, such as parasitic effects, noise, variations in production, software version being used, etc.

The methods and systems of the present disclosure, as described above and shown in the drawings, provide for determining system timing margins with superior properties including the ability to assess and monitor system timing margins for individual units without coupling to external devices or connectors that can introduce additional error. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:

1. An embedded built-in test circuit for testing a system timing margin of a processing device, the processing device having a controller and a first clock circuit, the first clock circuit generating a first clock signal, the first clock signal being a main clock signal provided for operation of the processing device, the built-in-test circuit comprising:
   a second clock circuit that is integrated with the processing device and that generates a second clock signal, wherein the frequency of the second clock signal is adjustable; and
   a logic circuit that is integrated with the processing device and that processes the first and second clock signals and outputs a third clock signal that is used to determine system timing margin of the processing device.

2. The embedded built-in test circuit of claim 1, wherein the second clock signal is asynchronous relative to the first clock signal.

3. The embedded built-in test circuit of claim 1, wherein the logic circuit includes a first logic gate that receives the second clock signal and the third clock signal and outputs a logic signal, the third clock being received as a feedback signal to the logic circuit.

4. The embedded built-in test circuit of claim 3, wherein the logic circuit further includes a second logic gate that receives the first clock signal and the logic signal and outputs the third clock signal.

5. The embedded built-in test circuit of claim 4, wherein the first logic gate is a logic OR gate and the second logic gate is a logic AND gate.

6. The embedded built-in test circuit of claim 1, wherein the frequency of the second clock signal is adjusted by a programmable PLL device.

7. The embedded built-in test circuit of claim 6, wherein the programmable PLL device is controlled by the controller.

8. The embedded built-in test circuit of claim 6, wherein pulse width of the third clock signal is based on the frequency of the second clock signal as adjusted by the programmable PLL.

9. The embedded built-in test circuit of claim 1, wherein a rising edge of the third clock signal is synchronized with a next rising edge of the second clock signal.

10. The embedded built-in test circuit of claim 1, wherein the second clock circuit is configured to maintain the second signal at a steady value when the processing device is configured for normal operation of the processing device during which testing for system timing margin is disabled to cause the third clock signal output by the logic circuit to be synchronized with the first clock signal steady value.

11. A processing device comprising:
a controller;
a first clock circuit, the first clock circuit generating a first clock signal, the first clock signal being a main clock signal provided for operation of the processing device; and
a built-in-test circuit for testing a system timing margin of the processing device, the built-in-test circuit comprising:
  a second clock circuit integrated with the processing device that generates a second clock signal that is asynchronous relative to the first clock signal, wherein the frequency of the second clock signal is adjustable; and
  a logic circuit integrated with the processing device that processes the first and second clock signals and outputs a third clock signal that is used to determine system timing margin of the processing device.

12. The processing device of claim 11, wherein the logic circuit includes:
a first logic gate that receives the second clock signal and the third clock signal and outputs a logic signal, the third clock being received as a feedback signal; and
a second logic gate that receives the first clock signal and the logic signal and outputs the third clock signal.

13. The processing device of claim 11, wherein the second clock circuit includes:
an oscillator outputting an oscillation signal; and
a programmable PLL receiving and modifying frequency of the oscillation signal and outputting the modified oscillation signal as the second clock signal.

14. The processing device of claim 11, wherein a rising edge of the third clock signal is synchronized with a next rising edge of the second clock signal.

15. The processing device of claim 11, wherein the second clock circuit is configured to maintain the second signal at a steady value when the processing device is configured for normal operation of the processing device during which testing for system timing margin is disabled to cause the third clock signal output by the logic circuit to be synchronized with the first clock signal steady value.

16. A method of testing a system timing margin of a processing device under-test, the method comprising:
generating, internal to the processing device, a second clock signal that is asynchronous relative to a first clock signal, the first clock signal being a main clock signal provided for operation of the processing device, wherein the frequency of the second clock signal is adjustable;
processing, internal to the processing device, the first clock signal and the second clock signal;
outputting a third clock signal based on the processing of the first and second clock signals; and
determining system timing margin of the processing device using the third clock signal.

17. The method of claim 16, wherein processing the first and second clock signals includes processing the third clock signal as a feedback signal with the first and second clock signals, to hold the state of the third clock signal that is output until the first clock signal changes state.

18. The method of claim 16, wherein processing the first and second clock signals includes:
processing the second clock signal and the third clock signal as a feedback signal using a logic OR operation;
outputting a logic signal based on a result of the OR operation; and
processing the first clock signal and the logic signal using a logic AND operation, the output of the AND operation being the third clock signal.

* * * * *